（12）United States Patent
Drew et al.

(10) Patent No.: US 9,065,222 B2
(45) Date of Patent: Jun. 23, 2015

(54) PRINTED CIRCUIT BOARD ASSEMBLY FOR A CONTROL DEVICE, CONTROL DEVICE FOR A MOTOR VEHICLE AND SIGNAL PROCESSING ARRANGEMENT

(71) Applicant: CONTINENTAL AUTOMOTIVE GMBH, Hannover (DE)

(72) Inventors: Gregory Drew, Regensburg (DE); Manfred Binder, Nuremberg (DE); Thomas Riepl, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 55 days.

(21) Appl. No.: 14/066,759

(22) Filed: Oct. 30, 2013

(65) Prior Publication Data

US 2014/0120749 A1    May 1, 2014

(30) Foreign Application Priority Data

Oct. 30, 2012   (EP) .................................... 12190542

(51) Int. Cl.
| | |
|---|---|
| *H01R 12/71* | (2011.01) |
| *H05K 5/00* | (2006.01) |
| *H05K 1/02* | (2006.01) |
| *H05K 3/00* | (2006.01) |

(52) U.S. Cl.
CPC .............. *H01R 12/71* (2013.01); *H05K 5/0069* (2013.01); *H05K 1/0278* (2013.01); *H05K 1/0298* (2013.01); *H05K 3/0044* (2013.01); *H05K 2201/09036* (2013.01); *H05K 2201/10295* (2013.01); *H05K 2203/302* (2013.01)

(58) Field of Classification Search
CPC ...................................................... H01R 12/71
USPC ............................................................ 439/78
See application file for complete search history.

(56) References Cited

U.S. PATENT DOCUMENTS

| | | | | |
|---|---|---|---|---|
| 5,777,850 | A |   | 7/1998 | Jakob et al. |
| 6,017,249 | A | * | 1/2000 | Akimoto et al. .............. 439/692 |
| 6,148,855 | A | * | 11/2000 | Rauner et al. ................. 137/560 |
| 6,195,261 | B1 | * | 2/2001 | Babutzka et al. ............. 361/752 |
| 6,360,438 | B1 | * | 3/2002 | Gladd et al. .................... 29/883 |

(Continued)

FOREIGN PATENT DOCUMENTS

| | | |
|---|---|---|
| DE | 4321331 A1 | 1/1995 |
| DE | 19701854 C1 | 5/1998 |

(Continued)

*Primary Examiner* — Alexander Gilman
(74) *Attorney, Agent, or Firm* — Laurence A. Greenberg; Werner H. Stemer; Ralph E. Locher

(57) ABSTRACT

A printed circuit board (PCB) assembly for a control device has a multi-layered PCB and a plug component. The PCB has a main section, a connection section, and a curved connecting section arranged between the main section and the connection section and connects the latter such that a main plane of extent of the main section runs at an incline to a main plane of extent of the connection section. The plug component has first and second plug connectors row which each contain a plug connector. Each plug connector has connecting elements with a connection part and a contact pin. The first and second plug connector rows follow one another in a stacking direction which is inclined to the main plane of extent of the main section such that the first plug connector row is at a larger distance from the main section than the second plug connector row.

11 Claims, 5 Drawing Sheets

(56) References Cited

U.S. PATENT DOCUMENTS

| | | | |
|---|---|---|---|
| 6,367,719 B1 * | 4/2002 | Wright | 239/585.1 |
| 6,392,895 B2 * | 5/2002 | Taguchi et al. | 361/752 |
| 6,402,569 B1 * | 6/2002 | Spadoni et al. | 439/723 |
| 6,434,014 B1 * | 8/2002 | Gerdom et al. | 361/752 |
| 6,442,027 B2 * | 8/2002 | Sanada et al. | 361/704 |
| 6,443,745 B1 * | 9/2002 | Ellis et al. | 439/101 |
| 6,616,480 B2 * | 9/2003 | Kameyama | 439/587 |
| 6,669,505 B2 * | 12/2003 | Wisniewski | 439/521 |
| 6,697,260 B1 * | 2/2004 | Chen et al. | 361/752 |
| 6,764,661 B1 * | 7/2004 | Girard | 422/305 |
| 6,802,721 B2 * | 10/2004 | Sanada et al. | 439/67 |
| 6,832,930 B2 * | 12/2004 | Kubota et al. | 439/404 |
| 6,835,073 B2 * | 12/2004 | Kobayashi | 439/76.2 |
| 7,081,691 B2 * | 7/2006 | Kawata | 307/9.1 |
| 7,097,494 B1 * | 8/2006 | Eakins et al. | 439/475 |
| 7,110,246 B2 * | 9/2006 | Tsunooka et al. | 361/637 |
| 7,736,158 B2 * | 6/2010 | Yamaguchi | 439/76.2 |
| 7,883,373 B2 | 2/2011 | Drew et al. | |
| 8,107,251 B2 | 1/2012 | Yamauchi | |
| 8,726,729 B2 * | 5/2014 | Matt | 73/431 |
| 8,780,564 B2 * | 7/2014 | Yanai et al. | 361/720 |
| 2001/0010303 A1 | 8/2001 | Caron et al. | |
| 2004/0014356 A1 | 1/2004 | Hallitschke et al. | |
| 2005/0056457 A1 | 3/2005 | Gall et al. | |

FOREIGN PATENT DOCUMENTS

| | | |
|---|---|---|
| DE | 102008004831 B3 | 6/2009 |
| DE | 102009013111 A1 | 9/2009 |
| EP | 1575344 A1 | 9/2005 |

* cited by examiner

PRINTED CIRCUIT BOARD ASSEMBLY FOR A CONTROL DEVICE, CONTROL DEVICE FOR A MOTOR VEHICLE AND SIGNAL PROCESSING ARRANGEMENT

CROSS-REFERENCE TO RELATED APPLICATION

This application claims the priority, under 35 U.S.C. §119, of European application EP 12190542, filed Oct. 30, 2012 n; the prior application is herewith incorporated by reference in its entirety.

BACKGROUND OF THE INVENTION

Field of the Invention

The present invention relates to a printed circuit board assembly for a control device for a motor vehicle and to a signal processing arrangement for a motor vehicle.

The increase in the functionality of engine control devices for motor vehicles has involved an increasing number of electrical connecting elements by which signals are transmitted from and/or to the control device.

BRIEF SUMMARY OF THE INVENTION

The object of the present disclosure is to specify a control device for a motor vehicle in which a particularly space-saving arrangement of the connecting elements and/or a particularly small width of the control device can be achieved.

A printed circuit board assembly for a control device is specified. In addition, a control device with the printed circuit board assembly is specified. The control device is, in particular, a control device for a motor vehicle, for example an engine control device. Furthermore, a signal processing arrangement is specified which contains, in particular, the printed circuit board assembly or the control device. The signal processing arrangement is, for example, an engine controller.

The printed circuit board assembly has a multi-layered printed circuit board and a plug component. In the present context, a "multi-layered printed circuit board" is understood to mean that the printed circuit board contains a plurality of circuit planes stacked one on top of the other, from at least one of which a circuit plane runs in the interior of a base body of the printed circuit board. In this context, electrical connecting conductors are expediently led from the circuit plane or planes running in the interior of the base body to an outer surface of the printed circuit board and connected there to electrical connection points. The multi-layered printed circuit board has, for example, four such stacked circuit planes or more, and in one development it has six stacked circuit planes or more. In particular, the number of stacked circuit planes is less than or equal to 15.

The printed circuit board has a main section, a connection section and a curved connecting section. The main section, the curved connecting section and the connection section occur, in particular, in this sequence with respect to one another. In other words, the curved connecting section is arranged between the main section and the connection section.

The main section and the connection section are connected to one another in a mechanically and electrically conductive fashion by the connecting section. The connection is carried out by the curved connecting section in such a way that a main plane of extent of the main section runs inclined with respect to a main plain of extent of the connection section. In particular, the main plane of extent of the main section and the main plane of extent of the connection section are perpendicular to one another. The main planes of extent are provided here, in particular, parallel to the circuit planes and/or to a main surface of the respective section provided for equipment. The main section, the connecting section and the connection section are, in particular, embodied in one piece.

In one preferred refinement, the connecting section is embodied in a semi-flexible fashion. This is achieved, in particular, by virtue of the fact that the connecting section has a reduced thickness compared to the main section and the connection section and has a glass-fiber-reinforced resin. The thickness is, in particular, the extent perpendicular to the main planes of extent of the main section or of the connection section in the extended state of the printed circuit board, that is to say in the case of a parallel orientation of the main planes of extent of the main section and of the connection section.

The fact that the connecting region is "semi-flexible" means, in particular, that it can be curved. For example, it can be shaped in such a way that by bending, for example by an application force to the main section and to the connection section of the printed circuit board, it can be changed from an extended shape into a curved shape. In this context, the printed circuit board is configured for at least one, and, in particular, for at most 20, for example at most ten, bending cycles. The connecting region is preferably dimensionally stable here owing to its semi-flexible embodiment such that after the bending it remains in the curved shape without the action of external forces (apart from the gravitational force of the printed circuit board).

"Glass-fiber-reinforced resin" is understood in the present context to be a fiber resin composite made of a resin and glass fibers. The resin is, for example, a duroplastic material such as polyester resin or preferably an epoxy resin. The glass-fiber-reinforced resin forms, in particular, the base body of the printed circuit board, at least in the region of the connecting section, preferably also in the region of the connection section and of the main section. The circuit planes with the electrical conductor tracks of the printed circuit board are, in particular, embedded in the glass-fiber-reinforced resin and/or applied thereto.

The plug component has at least one plug connector. In at least one refinement, it has a multiplicity of plug connectors, that is to say at least one further plug connector. For example, the plug component has four or more, preferably six or more plug connectors. In one refinement, it contains ten or fewer plug connectors.

The plug connector or the plug connectors has/have in each case a multiplicity of connecting elements. In one refinement, the connecting elements are arranged in rows or in rows and columns. The connecting elements each have a connection part and a contact pin.

The connection part is provided, in particular, for making external electrical contact with the control device, in particular for transmitting signals to the control device and/or from the control device. The connection parts are embodied, for example, as pins, hollow pins, sockets or the like.

The connection parts of a plug connector, in particular of each of the plug connectors, are each arranged in a common mount. For example, the plug component has a housing orifice. The mount projects, in particular, out of the housing orifice of the plug component.

In one preferred refinement, the mount or the mounts and the connection section of the printed circuit board are located on opposite sides of the housing orifice. The connection parts are expediently arranged on the side of the housing orifice facing away from the connection section. In one expedient refinement, the connecting elements run through the housing orifice. For example, they are encapsulated by injection molding with the housing orifice at certain locations.

The contact pins are electrically and mechanically connected to the connection section of the printed circuit board. For example, they are soldered and/or pressed together with the connection section. They advantageously have a main direction of extent which runs perpendicularly with respect to the main direction of extent of the connection section.

According to at least one refinement, the plug component has a multiplicity of plug connectors which are arranged in a first plug connector row and a second plug connector row. For example, each plug connector has two or more plug connectors, for example each plug connector has two, three, four or five plug connectors. The first and second plug connector rows follow one another in a stacking direction which is inclined with respect to the main plane of extent of the main section, with the result that the first plug connector row is at a larger distance from the main section than the second plug connector row. In particular, the stacking direction is parallel to the main plane of extent of the connection section. The number of connecting elements of a plug connector, in particular of each of the plug connectors which follow one another in the stacking direction is, in particular, smaller in the stacking direction than perpendicular thereto. In particular, the plug connectors have a larger extent in the direction of the rows, i.e. in a plan view of the main plane of extent of the connection section perpendicularly to the stacking direction than in the stacking direction.

The arrangement of the connecting elements in a plurality of plug connectors is advantageous compared to the arrangement in a relatively large plug connector because of the application of force necessary to produce the plug connection per plug connector. Advantageously, with the arrangement of the plug connectors in two rows arranged one on top of the other, the width of the printed circuit board assembly, and therefore of the control device, can be maintained even when there are a relatively large number of the connecting elements. In this way, the printed circuit board assembly and the control device can be manufactured particularly in a cost-effective and in a particularly space-saving fashion. The distribution of plug connectors on different sides of the printed circuit board assembly or of the control device is advantageously not necessary, with the result that the printed circuit board assembly can be connected particularly easily and is cost-effective. The formation of contacts by the contact pins which extend perpendicularly with respect to the connection section and the connection section which runs at an incline with respect to the main section is particularly space-saving here, essentially independently of the extent of the plug component of the stacking direction and is resistant to short-circuits and comparatively dimensionally stable, by virtue of the semi-flexible curved connecting section.

In one refinement, the connection section of the printed circuit board has a rectangular base shape in a plan view of its main plane of extent. It preferably has the same width as the main section. The width is here the dimension in the direction which, in the plan view of the printed circuit board in the extended state, is perpendicular to that direction in which the connection section, the semi-flexible connecting section and the main section follow one another. In particular, the printed circuit board has overall a rectangular base shape, in a plan view of the main planes of extent in the extended state. Such printed circuit boards can be manufactured particularly cost-effectively. In addition, in this way it is possible to achieve a particularly large base surface of the connection section, with the result that this can be used particularly well for electrically connecting the connecting elements and for signal processing. In this way, short signal paths can be achieved, with the result that the susceptibility to interference is particularly low.

For example, a first and a second of the connecting elements are connected in an electrically conductive fashion, in particular, for feeding signals through from the first to the second connecting element or for conducting a plurality of signals to an electronic component of the printed circuit board assembly. The first and the second connecting elements are not directly adjacent to one another, for example, and this means, in particular, that in the stacking direction or perpendicular to the stacking direction at least one further connecting element is arranged between the first and the second connecting elements. For example, the first connecting element is enclosed by a first of the plug connectors, and the second connecting element is enclosed by a second of the plug connectors, which is different from the first plug connector.

According to at least one refinement, the connection section has at least one electronic component. By the at least one electronic component, the connection section is preferably provided for filtering an overvoltage present at one of the connecting elements and/or for smoothing a signal present at one of the connecting elements and/or for amplifying a signal present at one of the connecting elements.

According to at least one refinement, the width of the first plug connector row is at least as large or at maximum 10% smaller than the width of the second plug connector row. Such a refinement advantageously permits a particularly large number of connecting elements with respect to the width of the control device.

According to at least one further refinement, the housing orifice of the plug component has a first sealing section and a second sealing section. The sealing sections are expediently provided for interacting with a corresponding sealing section of a housing component of the control device in order to seal the control device. For example, a sealing mass is applied to the first or second sealing section of the housing orifice and/or to the corresponding respective sealing section of the housing component and pressed together during the mounting of the control device between the first and the second sealing sections of the housing orifice and the corresponding sealing section of the housing component.

The first and second sealing sections of the housing orifice run inclined with respect to the main plane of extent of the main section of the printed circuit board. They preferably also run inclined with respect to the main plane of extent of the connection section of the printed circuit board. In one refinement, the first and second sealing sections run at an angle between 50° and 80°, preferably between 60° and 70° with respect to the main plane of extent of the main section of the printed circuit board, wherein the boundaries are respectively enclosed. In another development, the first and the second sealing sections run parallel to a plane which is perpendicular to the main plane of extent of the connection section. They particularly preferably run parallel to a plane which is spanned by the normal vectors onto the main planes of extent of the main section and of the connection section. For example, they run in a plan view of the main plane of extent of the main section parallel to the longitudinal edges thereof. The longitudinal edges of the main section are here the side edges of the main section which adjoin the connecting section and run away in the direction of the connection section. In this context, the side faces which laterally bound the main section in the plan view of the main plane of extent are referred to as side edges.

The main section, to be more precise a portion of the main section, of the printed circuit board is preferably arranged in a plan view of the main plane of extent of the main section between the first and second sealing sections. In other words, the first sealing section, the printed circuit board and the second sealing section follow one another in a lateral direction, i.e. in particular perpendicularly with respect to the normal vector onto the main plane of extent of the main section, in this order. In this way, the first and the second sealing sections are advantageously arranged on side walls of the control device which are at an angle to the side wall which has the plug connectors. The space available for the plug connectors is therefore advantageously particularly large on the side wall mentioned last.

By the profile, inclined with respect to the main section, of the sealing sections, a satisfactory sealing effect can be achieved between the sealing sections and the sealing sections of the corresponding housing component if the housing component is fitted onto the printed circuit board assembly perpendicularly, that is to say in the direction of the normal vector onto the main plane of extent of the main section. Such a method of manufacture is particularly easy and cost-effective.

The profile of the first and second sealing sections in a plane perpendicular to the main plane of extent of the connection section and the profile of the connection section inclined with respect to the main section advantageously permit a particularly large surface of the printed circuit board by the curved connection section. The large surface can extend essentially over the entire width of the control device in the region of the connection section and at the same time have an advantageous basic shape, in particular a rectangular one. In particular, it is possible to dispense with reducing the width of the connection section in the direction away from the main section, which leads, for example, to a trapezoidal base shape of the connection section.

The signal processing device preferably has a cable harness which is connected to the plug component. The cable harness is preferably free of splice points. Two cables of the cable harness are connected to one another in an electrically conductive fashion by a first and a second of the connecting elements and a conductor track of the connection section. Such a cable harness which is free of splice points can be manufactured particularly easily, in particular by a machine, and cost-effectively.

According to one aspect, a printed circuit board assembly is specified for a control device of a motor vehicle having a multi-layered printed circuit board and a plug component. The printed circuit board has a main section and a connection section as well as a curved connecting section which is arranged between the main section and the connection section and connects the latter mechanically and electrically in such a way that a main plane of extent of the main section runs inclined with respect to a main plane of extent of the connection section. The plug component has a first and a second plug connector row which each contain at least one plug connector. Each plug connector has a multiplicity of connecting elements with a connection part and a contact pin, wherein the connection parts are arranged in a common mount and the contact pins are electrically and mechanically connected to the connection section and have a main direction of extent which runs perpendicularly with respect to the main plane of extent of the connection section. The first and second plug connector rows follow one another in a stacking direction inclined with respect to the main plane of extent of the main section, such that the first plug connector row is at a larger distance from the main section than the second plug connector row. The curved connecting section is embodied so as to be semi-flexible by means of a reduced thickness compared to the main section and the connection section, and by a glass-fiber-reinforced resin.

With the printed circuit board assembly there is advantageously no need to increase the width even when there is an increased number of connecting elements. The formation of contact by the contact pins which extend perpendicularly with respect to the connection section and the connection section which runs inclined with respect to the main section is particularly space-saving here, essentially independently of the extent of the plug component in the stacking direction, resistant to short circuits and comparatively dimensionally stable by virtue of the semi-flexible curved connecting section. In this way, the printed circuit board assembly and the control device can be manufactured in a particularly cost-effective way and are particularly space-saving.

Other features which are considered as characteristic for the invention are set forth in the appended claims.

Although the invention is illustrated and described herein as embodied in a printed circuit board assembly for a control device, a control device for a motor vehicle and a signal processing arrangement, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE INVENTION

Figure 1:
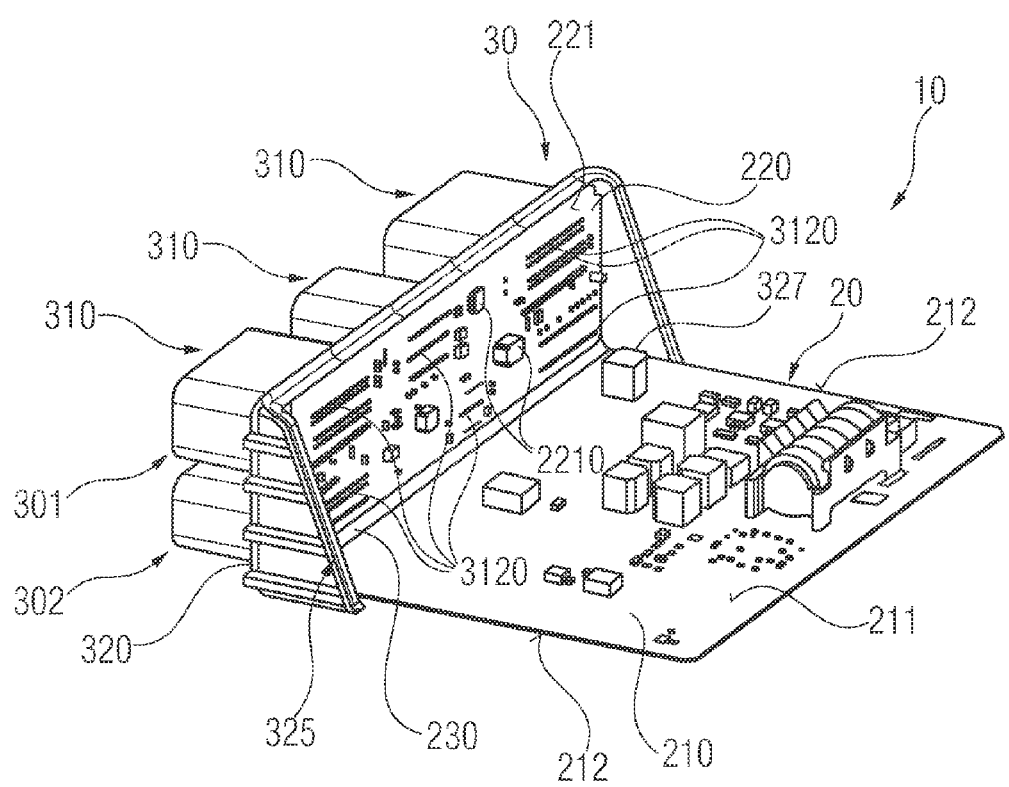
FIG. 1 is a diagrammatic, perspective view of a printed circuit board assembly of a first exemplary embodiment according to the invention.
Figure 2:
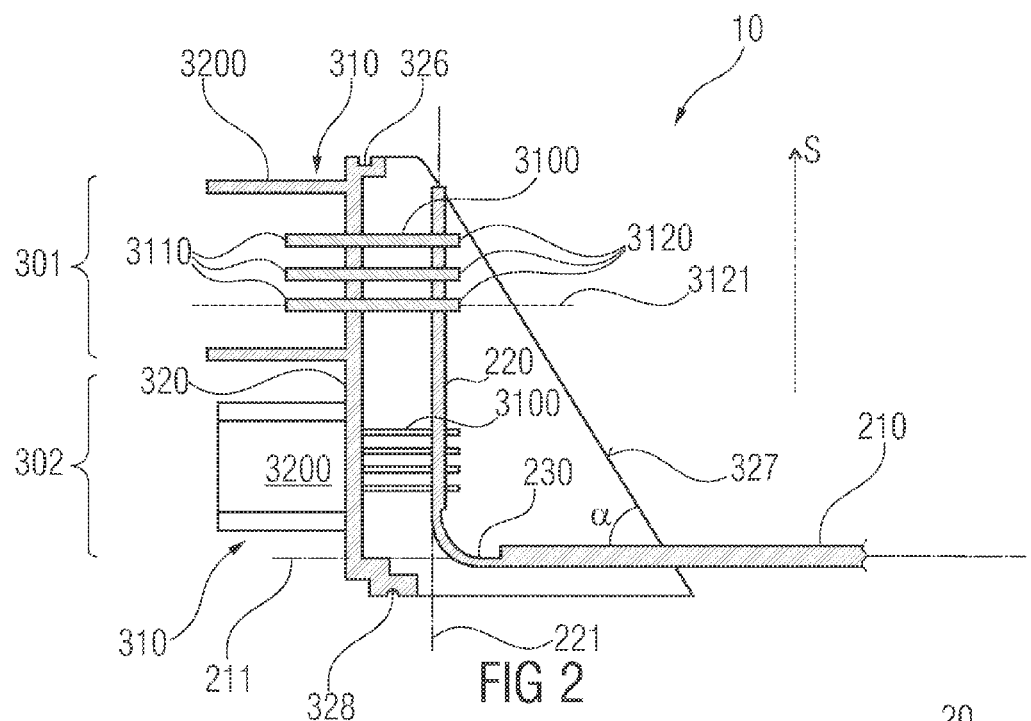
FIG. 2 is a cross-sectional view, not true to scale, through the printed circuit board assembly according to the first exemplary embodiment.
Figure 4:
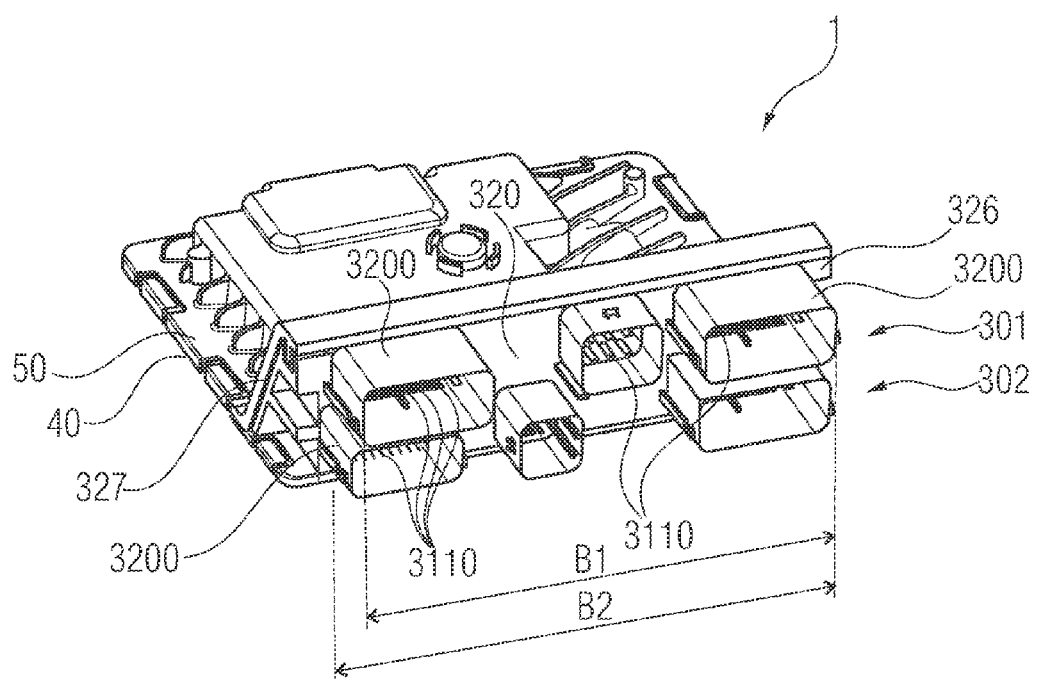
FIG. 4 is a perspective view of an exemplary embodiment of a control device with the printed circuit board assembly according to the first exemplary embodiment.
Figure 5:
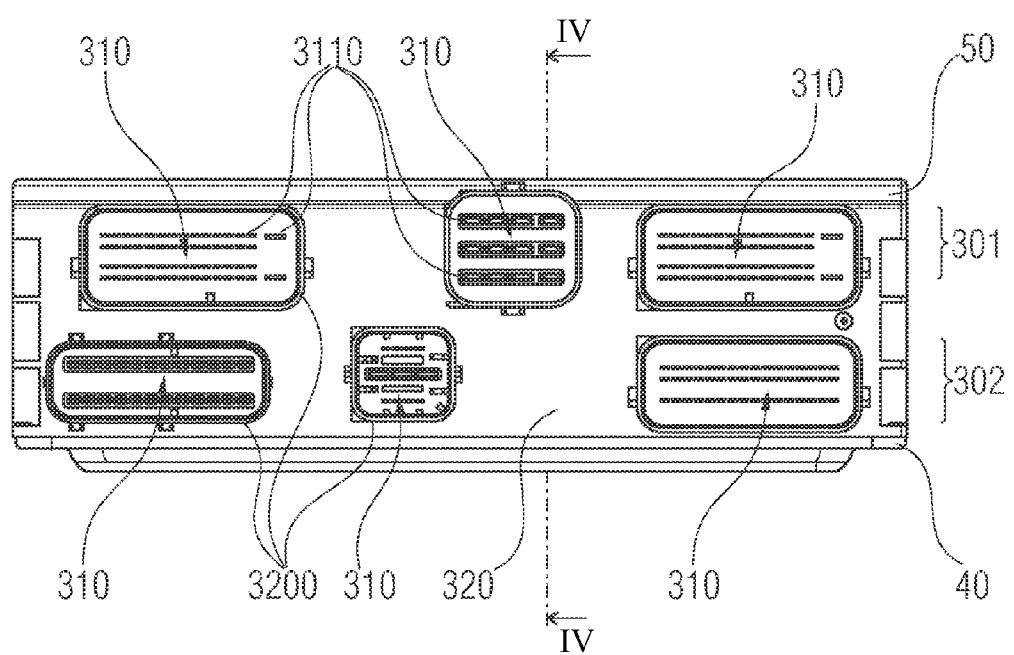
FIG. 5 is a side view of the control device according to the exemplary embodiment in FIG. 4.

Referring now to the figures of the drawing in detail and first, particularly, to FIG. 1 thereof, there is shown a schematic perspective view of a printed circuit board assembly 10 according to a first exemplary embodiment. FIG. 2 shows a schematic cross section through the printed circuit board assembly 10 taken along the plane IV-IV shown in FIG. 4. FIG. 4 shows a schematic perspective view of a control device 1 with the printed circuit board assembly 10. The perspective view in FIG. 4 is rotated with respect to that in FIG. 1. FIG. 5 shows a side view of the control device in FIG. 4 in which the sectional plane IV-IV is marked.

The printed circuit board assembly 10 has a printed circuit board 20 and a plug component 30.

Figure 3A:
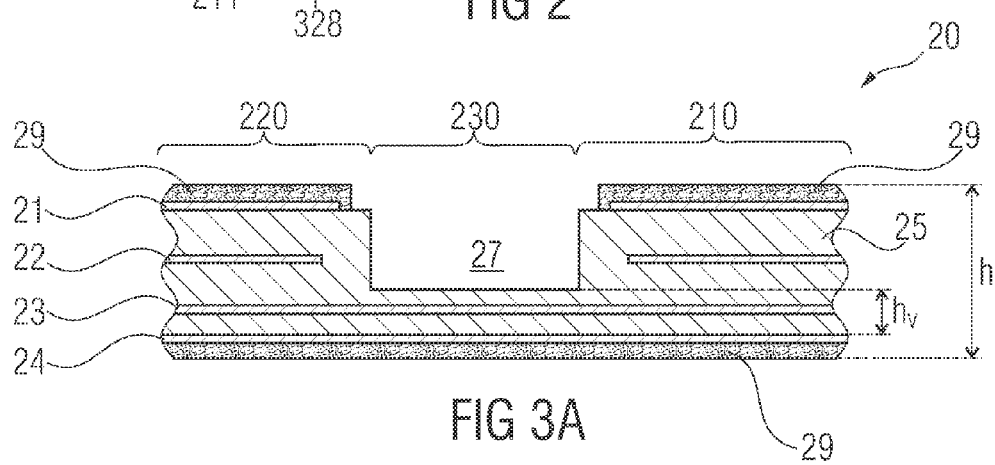
FIG. 3A is a cross-section view, not true to scale, through a detail of the printed circuit board of the printed circuit board assembly according to the first exemplary embodiment.
Figure 3B:
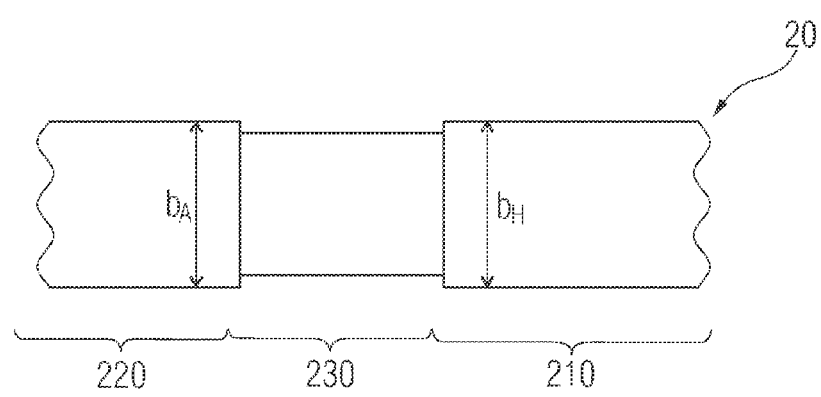
FIG. 3B is a plan view, not true to scale, of the detail of the printed circuit board according to FIG. 3A.

FIG. 3A shows a schematic cross section and FIG. 3B shows a schematic plan view of a detail of the printed circuit board 20.

The printed circuit board 20 is a multi-layered printed circuit board. It has a base body 25 which is provided with conductor tracks 21, 22, 23, 24 in a plurality of circuit planes stacked one on top of the other. This is a four-layered printed circuit board 20 in which the conductor tracks of two circuit planes 22, 23 are embedded in the base body 25, and the conductor tracks of two further circuit planes 21, 24 are applied to opposite external faces of the base body 25. The conductor tracks 21, 24 which are applied to the external faces of the base body 25 can be covered in certain locations, for example, with a resist layer 29, wherein there are expediently connection points which are not covered by the resist layer 29. The conductor tracks 23, 24 of the circuit planes which are embedded in the base body 25 are, for example, led by vias which are not illustrated in the drawings to electrical contact points at at least one external surface of the base body 25, with the result that they can be connected there in an electrically conductive fashion.

The printed circuit board 20 contains a depression 27, in particular a chamfer, which extends in a lateral direction over the entire width of the printed circuit board 20. In the region of the depression 27 the thickness $h_v$ of the base body 25 is reduced. In particular, the depression penetrates in the direction in which the circuit planes follow one another, in the present case two of the circuit planes which are associated with the conductor tracks 21 and 22 in FIG. 3A. For example, a thickness $h_v$ in the region of the depression 27 is 0.5 mm or less, preferably 0.25 mm or less. In one refinement, it is 0.1 mm or more. The entire thickness h of the printed circuit board 20 is, for example, 1 mm or more, in particular 1.5 mm or more. In one refinement it is 2.5 mm or less.

By means of the depression 27, a connecting section 230 of the printed circuit board 20 is formed which is arranged between a main section 210 and a connection section 220 of the printed circuit board 20 and connects the latter mechanically and electrically. The electrical connection is produced for example by the conductor tracks 23 and 24 which are arranged in two different circuit planes and which run from the main section 210 through the connecting region 230 to the connection section 220.

The base body 25 has, at least in the region of the connecting section 230, preferably also in the region of the main section 210 and of the connection section 220, a glass-fiber-reinforced epoxy resin. By the glass-fiber-reinforced epoxy resin and the reduced thickness $h_v$, the connecting region 230 is made semi-flexible, with the result that it can be deformed in a curved fashion by bending, wherein the printed circuit board 20 is configured for at least two and at maximum ten bending cycles.

While in FIGS. 3A and 3B the printed circuit board 20 is illustrated in the extended state, in the installed state in the printed circuit board assembly 10 (see, for example, FIG. 2) the connecting region 230 of the printed circuit board 20 is curved in such a way that a main plane 211 of extent of the main section 210 a main plane 221 of extent of the connection section 220 run inclined with respect to one another, perpendicularly in the present exemplary embodiment. The connecting region 230 is preferably dimensionally stable here, owing to its semi-flexible embodiment, in such a way that after bending it remains in the curved shape without the effect of external forces on the printed circuit board 20.

The printed circuit board assembly 10 also has a plug component 30 which contains a multiplicity of plug connectors 310 and a housing orifice 320. The housing orifice 320 forms a housing of the control device 1, for example together with a first housing component and a second housing component 50 (see FIG. 4). In the case of the control device 1, the printed circuit board 20 is arranged in the housing.

The plug connectors 310 are arranged in two rows, a first plug connector row 301 and a second plug connector row 302. In the present exemplary embodiment, in each case three plug connectors 310 follow one another in the row, i.e. in the direction of the row. The first and second plug connector rows 301, 302 follow one another in a stacking direction S. The stacking direction S is inclined with respect to the main plane 211 of extent of the main section 210, in the present case perpendicularly. In this way, the plug connectors 310, which are arranged in the first plug connector row 301, are at a larger distance from the main section 210 than the plug connectors 310 which are arranged in the second plug connector row 302. In addition, the stacking direction S runs parallel to the main plane 221 of extent of the connection section 220 of the printed circuit board here. In particular, the stacking direction S, the normal vector onto the main plane of extent of the connection section 220 and the direction of the rows are respectively perpendicular to one another here.

Each plug connector 310 has an electrical connection field with a multiplicity of connecting elements 3100. The connecting elements 3100 each have a connection part 3110 and a contact pin 3120 which are embodied, for example, in one piece. The connection parts 3110 of the respective connection fields are each arranged running in parallel with the direction of the rows, wherein a plurality of rows follow one another in the stacking direction S. At least some of the connection parts 3110 are respectively arranged in parallel with the columns running in the stacking direction.

The connection parts 3110 project out of the housing orifice 320 from a side of the housing orifice 320 facing away from the connection section 220 of the printed circuit board 20. The connection parts 3110 are arranged in a common mount 3200 which also projects out of the housing orifice 320 on the side facing away from the connection section 220. The mounts can have, for example, the same extent in the direction of the rows and in the stacking direction. Alternatively, they can have, for example, a larger extent in the direction of the rows than in the stacking direction.

The contact pins 3320 project from the housing orifice 320 on the side of the housing orifice 320 facing the connection section 220, and are electrically and mechanically connected to the connection section 220, in particular to one of the conductor tracks 21, 22, 23 or 24 in each case. In particular, they are soldered to a conductor track 21-24 of the connection section 220 or pressed with the connection section 220 to produce electrical and mechanical contact without soldering.

The contact pins 3120 have a main direction of extent 3121 which runs perpendicularly to the main plane 221 of extent of the connection section 220. In this way, a particularly space-saving connection of the contact pins 3120 to the printed circuit board 20 can be achieved, and the connection between the printed circuit board 20 and the plug component 30 can be produced particularly easily. For example, it is advantageously possible to dispense with electrical connecting lines which run obliquely with respect to the printed circuit board. In the stacking direction S, the printed circuit board assembly 10 can be scaled particularly easily in this way over a large area.

The connection section 220 and the main section 210 mainly have the same width $b_A$ and $b_H$. The width is here the lateral extent perpendicularly with respect to the direction in which, in the extended state of the printed circuit board 20 the main section 210, the connecting section 230 and the connection section 220 follow one another (see for example FIG. 3B). The connecting section 230 can have the same width $b_A$, $b_H$ as the connection section 220 or main section 210. The width of the connecting section can, however, also be smaller, as indicated in FIG. 3B, for example in order to set the flexibility of the connecting region 230.

The connection section 220 also has a rectangular base shape (see for example FIG. 1) in a plan view of its main plane 221 of extent. This means, in particular, that the connection section 220 has an external contour which is rectangular with the exception of cutouts which may be provided, for example, as an adjustment aid. In this way, a particularly large width B1 of the first plug connector row 301 can be achieved. In particular, the widths B1, B2 of the first plug connector row 301 and of the second plug connector row 302 are essentially the same size (see, for example, FIGS. 4 and 5), i.e. in particular the widths B1 and B2 differ from one another by 10% or less. In the present exemplary embodiment, the width B1 of the first plug connector row 310 is approximately 6% smaller than the width B2 of the second plug connector row 302. In one variant of this exemplary embodiment, the widths B1 and B2 have the same value.

The rectangular connection section 220, which has the same width as the main section 210, provides enough space in order to arrange electronic components 2210 on the connection section 220 in addition to forming contact with the connecting elements 3100. The electronic components 2210 may be provided, for example, for filtering an overvoltage which is present at one or more connecting elements, for smoothing a signal present at one of the connecting elements and/or for amplifying a signal present at one of the connecting elements. The electrical line paths from the connecting elements 2100 to the components 2210 arranged on the connection section 220 are advantageously particularly short, with the result that a particularly low loss of signal quality and a particularly low susceptibility to interference can be achieved.

In addition, two connecting elements 2100 can be connected to one another in an electrically conductive fashion by the conductor track 21 of the connection section 220.

Figure 6:
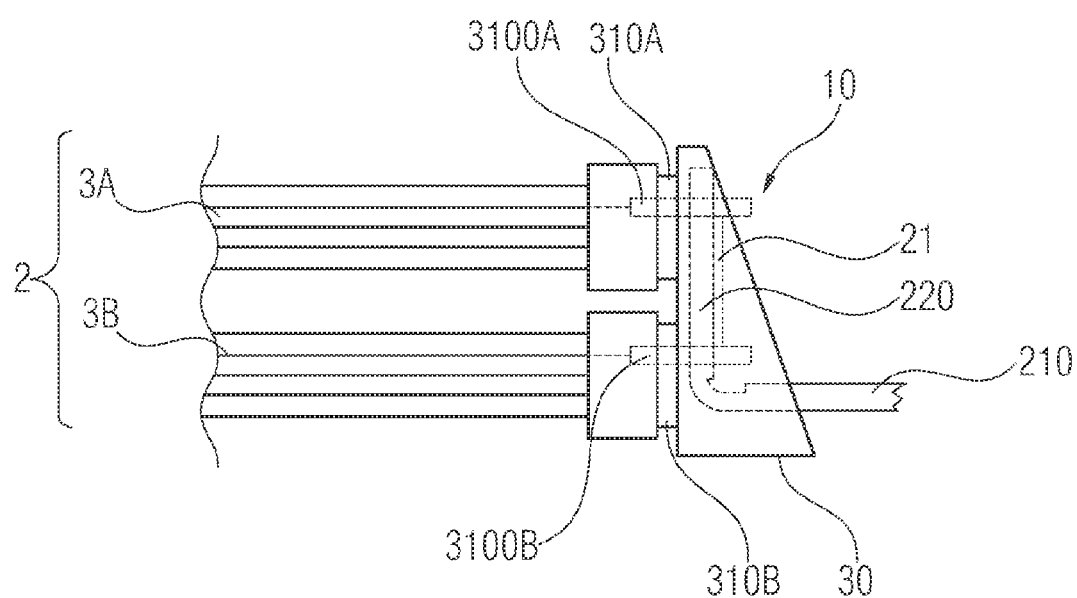
FIG. 6 is a schematic side view, not true to scale, of an exemplary embodiment of a signal processing arrangement with the printed circuit board assembly according to the first exemplary embodiment.

FIG. 6 shows this on the basis of a schematic side view of a signal processing arrangement with the printed circuit board assembly 10 according to the first exemplary embodiment described here.

For example a first connecting element 3100A, which is arranged in a first plug connector 310A, and a second connecting element 3100B, which is arranged in a second plug connector 310B, are connected to one another in an electrically conductive fashion by the conductor track 21. In this way, two cables 3A, 3B of a cable harness 2, which is connected to the plug component 30 of the printed circuit board assembly 10 or of the control device 1, are connected to one another in an electrically conductive fashion by the connecting elements 3100A, 3100B via the conductor track 21 of the connection section 220.

For example, it is possible in this way for a signal of a first cable line, to which the first cable 3A belongs, to be directed via the control device 1 to a second cable line to which the second cable 300B belongs. It is not necessary to splice the cable lines for this purpose. Therefore, the cable harness is, for example, free of splicing points, with the result that it can be produced particularly easily and cost-effectively.

In order to protect the printed circuit board 20 against environmental influences, the latter is arranged in an interior space of a housing of the control device 1. The housing is formed, for example, by the plug component 30, a first housing component 40 and a second housing component 50. In this context, the housing orifice 320 of the plug component 30 has, in particular, a plastic material. The first and second housing components 40, 50 are, for example, aluminum cast parts or steel plate parts, in particular galvanically tin-plated steel plate parts.

In order to seal the interior space, the housing orifice has a first and a second sealing section 325, 327 which each interact with a corresponding section of the second housing component 50 in order to seal the interior space. In a plan view of its main plane 211 of extent, the main section 210 of the printed circuit board 20 is arranged between the first sealing section 325 and the second sealing section 327. In this context, the first and second sealing sections 325, 327 run, in particular, parallel to the longitudinal edges 212 of the main section 210 in a plan view of the main plane 211 of extent of the main section 210. The longitudinal edges 212 are those side edges which run parallel to that direction in which the main section 210, the connecting section 230 and the connection section 220 follow one another in the extended state of the printed circuit board 20. In particular, the longitudinal edges run parallel to the main direction 3121 of extent of the contact pins 3120 and to the normal vector onto the main plane 211 of extent of the main section 210.

In this context, the first and second sealing sections 325, 327 are inclined with respect to the main plane 211 of extent of the main section 210 by an angle $\alpha$ which has, for example, a value between 60° and 70°, wherein the boundaries are enclosed (see FIG. 2).

The plug component 30 expediently has further sealing sections 326, 328. The further sealing sections 326, 328 run, for example, in a U shape around the connection section 220 in a plan view of the main plane 211 of extent of the main section 210.

By the first and second sealing sections 325, 327 which laterally surround the printed circuit board 210 it is possible for these further sealing sections 326, 328 to run advantageously over the entire width of the control device 1 parallel to the main plane 211 of extent of the main section 210, with the result that a particularly large width B1, B2 of the plug connector rows 301, 302 can be achieved. The inclined profile, not perpendicular, of the first and second sealing sections 325, 327 makes it possible to achieve a satisfactory sealing effect in the region of the first and second sealing sections 325, 327 when the second housing component 50 is fitted on perpendicularly.

The invention is not restricted to the exemplary embodiments as a result of the description on the basis of these exemplary embodiments. Instead, the invention contains any new feature and any combination of features which includes, in particular, any combination of features in the exemplary embodiments and patent claims.

The invention claimed is:

1. A printed circuit board assembly for a control device of a motor vehicle, the printed circuit board assembly comprising:
   a multi-layered printed circuit board having a main section, a connection section, a curved connecting section disposed between said main section and said connection section and connecting said connection section mechanically and electrically such that a main plane of extent of said main section runs inclined with respect to a main plane of extent of said connection section;

a plug component having a first and a second plug connector row each containing at least one plug connector and a common mount, said plug connector having a multiplicity of connecting elements with a connection part and a contact pin, said connection part disposed in said common mount, said contact pin connected electrically and mechanically to said connection section and having a main direction of extent running perpendicularly with respect to the main plane of extent of said connection section, said first and second plug connector rows following one another in a stacking direction being inclined with respect to the main plane of extent of said main section such that said first plug connector row being at a larger distance from said main section than said second plug connector row; and said curved connecting section made semi-flexible by a thickness being reduced compared to said main section and said connection section, and by a glass-fiber-reinforced resin.

2. The printed circuit board assembly according to claim 1, wherein the stacking direction runs parallel to the main plane of extent of said connection section.

3. The printed circuit board assembly according to claim 1, wherein a width of said first plug connector row is at maximum 10% smaller than a width of said second plug connector row.

4. The printed circuit board assembly according to claim 1, wherein said connection section has a rectangular base shape in a plan view of the main plane of extent of said connection section.

5. The printed circuit board assembly according to claim 1, wherein:

said plug component has a housing orifice formed therein and from which said common mount projects, said housing orifice has a first and a second sealing section which are each provided for interacting in order to seal the control device with a corresponding sealing section of a housing component of the control device;

said sealing sections run inclined with respect to the main plane of extent of said main section of said printed circuit board; and said main section of said printed circuit board is disposed between said first and the second sealing sections in a plan view of the main plane of extent of said main section.

6. The printed circuit board assembly according to claim 1, wherein said connection section has at least one electronic component and is provided, by means of said electronic component, for filtering an overvoltage present at one of said connecting elements, or for smoothing or amplifying a signal present at one of said connecting elements.

7. The printed circuit board assembly according to claim 1, wherein said connection section has a conductor track and a first and a second of said connecting elements are connected in an electrically conductive fashion by said conductor track of said connection section.

8. The printed circuit board assembly according to claim 7, wherein said first and second connecting elements are not directly adjacent to one another.

9. The printed circuit board assembly according to claim 8, wherein said first connecting element is disposed in a first of said plug connectors, and said second connecting element is disposed in a second of said plug connectors.

10. A control device for a motor vehicle, comprising:
a printed circuit board assembly, containing:
a multi-layered printed circuit board having a main section, a connection section, a curved connecting section disposed between said main section and said connection section and connecting said connection section mechanically and electrically such that a main plane of extent of said main section runs inclined with respect to a main plane of extent of said connection section;

a plug component having a first and a second plug connector row each containing at least one plug connector and a common mount, said plug connector having a multiplicity of connecting elements with a connection part and a contact pin, said connection part disposed in said common mount, and said contact pin connected electrically and mechanically to said connection section and having a main direction of extent running perpendicularly with respect to the main plane of extent of said connection section, said first and second plug connector rows following one another in a stacking direction being inclined with respect to the main plane of extent of said main section such that said first plug connector row being at a larger distance from said main section than said second plug connector row; and said curved connecting section made semi-flexible by a thickness being reduced compared to said main section and said connection section, and by a glass-fiber-reinforced resin.

11. A signal processing configuration for a motor vehicle, comprising:
a printed circuit board assembly, containing:
a multi-layered printed circuit board having a main section, a connection section, a curved connecting section disposed between said main section and said connection section and connecting said connection section mechanically and electrically such that a main plane of extent of said main section runs inclined with respect to a main plane of extent of said connection section;

a plug component having a first and a second plug connector row each containing at least one plug connector and a common mount, said plug connector having a multiplicity of connecting elements with a connection part and a contact pin, said connection part disposed in said common mount, said contact pin connected electrically and mechanically to said connection section and having a main direction of extent running perpendicularly with respect to the main plane of extent of said connection section, said first and second plug connector rows following one another in a stacking direction being inclined with respect to the main plane of extent of said main section such that said first plug connector row being at a larger distance from said main section than said second plug connector row;

said curved connecting section made semi-flexible by a thickness being reduced compared to said main section and said connection section, and by a glass-fiber-reinforced resin; and said connection section having a conductor track and a first and a second of said connecting elements are connected in an electrically conductive fashion by said conductor track of said connection section; and a cable harness connected to said plug component, said cable harness being free of splice points, said cable harness having two cables connected in an electrically conductive fashion by said first and second connecting elements, via said conductor track of said connection section.

* * * * *